(12) United States Patent
Moosbauer

(10) Patent No.: US 8,729,871 B2
(45) Date of Patent: May 20, 2014

(54) CIRCUIT AND METHOD FOR CONTROLLING THE POWER SUPPLY OF A CONSUMER WITH CURRENT PULSES HAVING STEEP FLANKS

(75) Inventor: Peter Moosbauer, Penzberg (DE)

(73) Assignee: Messtec Power Converter GmbH, Penzberg (DE)

( * ) Notice: Subject to any disclaimer, the term of this patent is extended or adjusted under 35 U.S.C. 154(b) by 156 days.

(21) Appl. No.: 12/743,387

(22) PCT Filed: Nov. 7, 2008

(86) PCT No.: PCT/EP2008/009408
§ 371 (c)(1),
(2), (4) Date: Jul. 29, 2010

(87) PCT Pub. No.: WO2009/068164
PCT Pub. Date: Jun. 4, 2009

(65) Prior Publication Data
US 2011/0044079 A1    Feb. 24, 2011

(30) Foreign Application Priority Data
Nov. 27, 2007    (DE) .......................... 10 2007 056 956

(51) Int. Cl.
*G05F 1/00*    (2006.01)

(52) U.S. Cl.
USPC ........................................................ 323/271

(58) Field of Classification Search
USPC ......... 323/269, 271–272, 282–283, 234, 237, 323/265, 268
See application file for complete search history.

(56) References Cited

U.S. PATENT DOCUMENTS

| | | | |
|---|---|---|---|
| 4,750,100 A | 6/1988 | Ragsdale | |
| 4,992,921 A | 2/1991 | Albach et al. | |
| 5,764,037 A | 6/1998 | Jacobs et al. | |
| 5,804,925 A * | 9/1998 | Salbert et al. | 315/209 R |

(Continued)

FOREIGN PATENT DOCUMENTS

| | | |
|---|---|---|
| DE | 2219043 | 10/1973 |
| DE | 3718941 | 2/1988 |

(Continued)

OTHER PUBLICATIONS

Translation of the PCT International Preliminary Report on Patentability for PCT Application No. PCT/EP2008/009408.

(Continued)

*Primary Examiner* — Matthew Nguyen
*Assistant Examiner* — Jeffrey Gblende
(74) *Attorney, Agent, or Firm* — Gardner, Linn, Burkhart & Flory LLP

(57) ABSTRACT

The present invention concerns a circuit for operating a consumer comprising a current source to provide a power supply for a consumer and a first switch connected in parallel with the consumer, in which through opening and closing of the first switch the power is transmitted to the consumer in the form of square wave current pulses. Here, a second switch is connected in parallel to the first switch and in series to the consumer which is opened and closed in anti-phase manner to the first switch, and a load with high load voltage is connected in parallel to the first switch and in series to the consumer. Furthermore, the present invention concerns a method for operating a circuit.

16 Claims, 6 Drawing Sheets

(56) References Cited

U.S. PATENT DOCUMENTS

| | | | |
|---|---|---|---|
| 6,292,341 B1 * | 9/2001 | Milanesi et al. | 361/79 |
| 2002/0093836 A1 | 7/2002 | Goepfrich et al. | |
| 2002/0171298 A1 * | 11/2002 | Chen et al. | 307/127 |
| 2004/0217747 A1 * | 11/2004 | Ying et al. | 323/282 |
| 2006/0186934 A1 * | 8/2006 | Nishimura | 327/108 |
| 2007/0230228 A1 | 10/2007 | Mao | |
| 2007/0296278 A1 * | 12/2007 | Sekiya et al. | 307/107 |
| 2008/0074093 A1 * | 3/2008 | DeWitt et al. | 323/282 |
| 2009/0091950 A1 * | 4/2009 | Chao et al. | 363/15 |
| 2010/0109617 A1 * | 5/2010 | Erdl | 323/222 |
| 2010/0231178 A1 * | 9/2010 | Handa et al. | 320/163 |
| 2010/0283321 A1 | 11/2010 | Moosbauer | |
| 2011/0057519 A1 | 3/2011 | Wakatsuki et al. | |

FOREIGN PATENT DOCUMENTS

| | | |
|---|---|---|
| DE | 3840304 | 5/1990 |
| DE | 4440013 | 3/1996 |
| DE | 19517875 | 11/1996 |
| DE | 102005002359 | 7/2006 |
| EP | 0060020 | 9/1982 |
| EP | 1714725 | 10/2006 |
| EP | 1714725 A1 * | 10/2006 |
| WO | 2006/057365 | 1/2006 |

OTHER PUBLICATIONS

PCT Search Report for PCT International Application No. PCT/EP2008/009408 dated Mar. 9, 2009.

Shoyama et al. "Common-Mode Noise Reduction by Current Cancellation in Balanced Buck-Boost Switching Converter", Intelec 2003, 25th, International Telecommunications Energy Conference, Yokohama, Japan, Oct. 19-23, 2003.

* cited by examiner

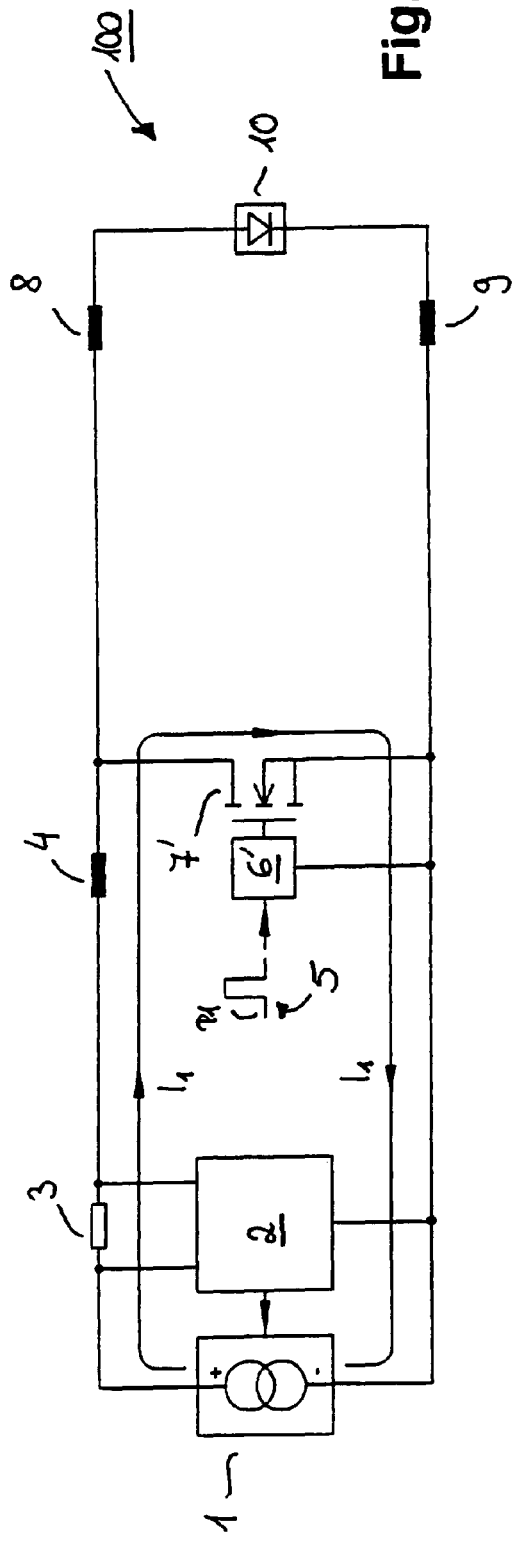
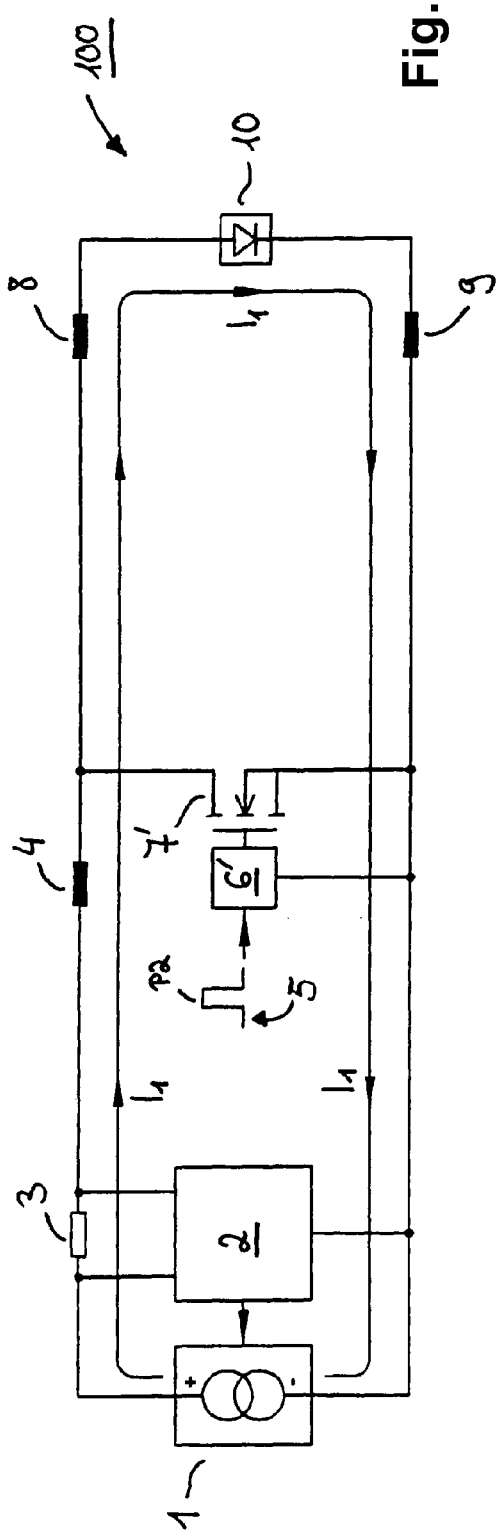

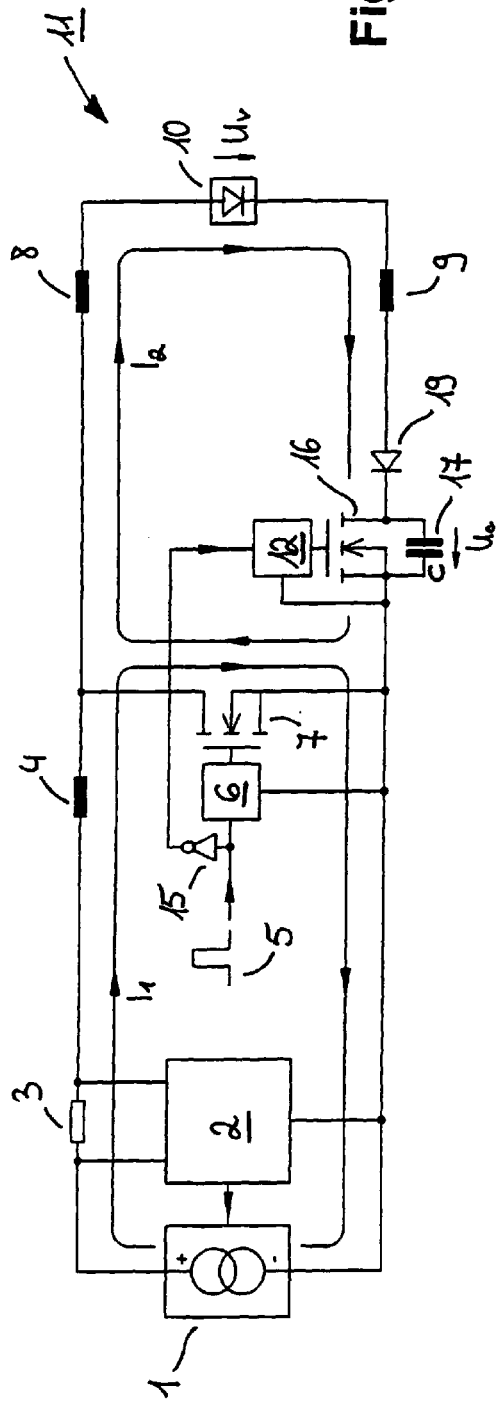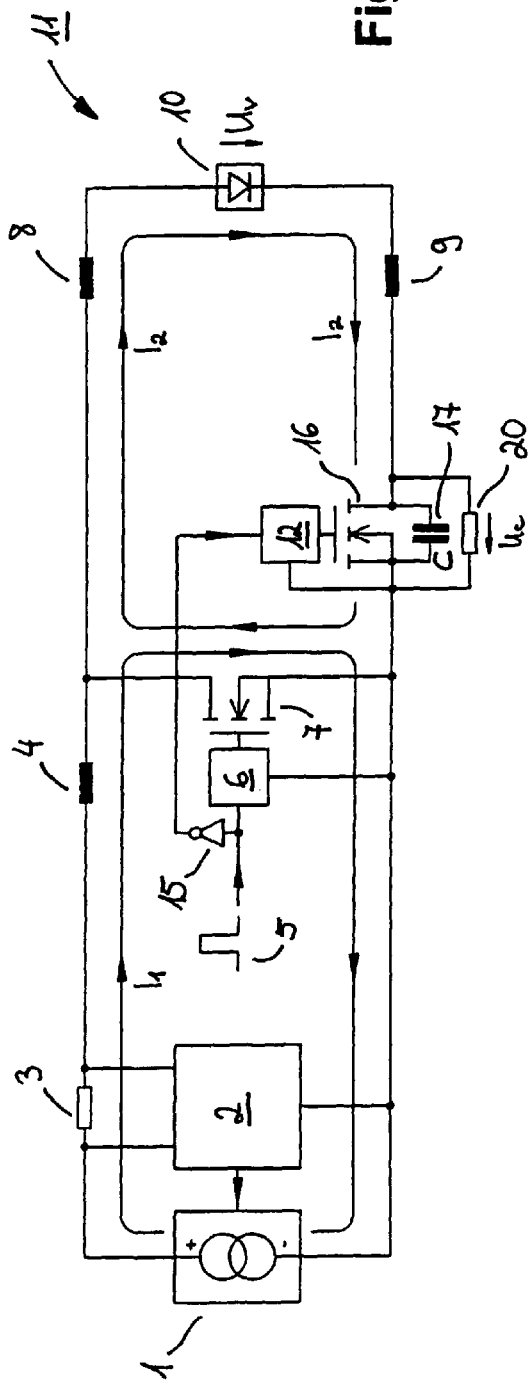

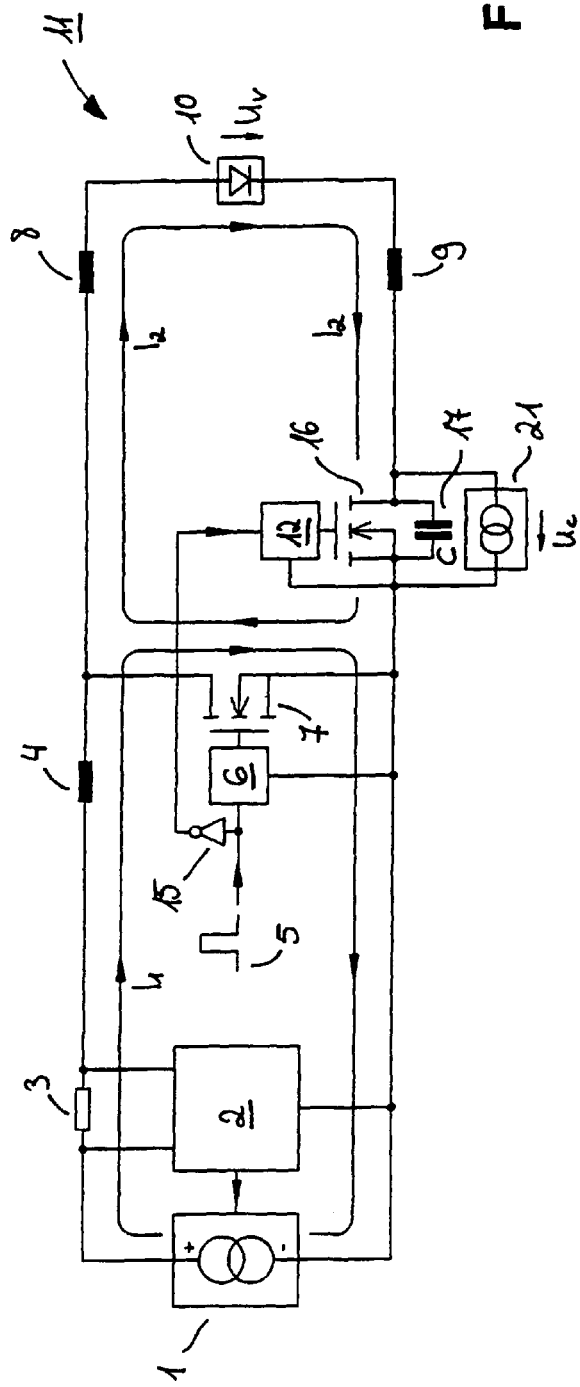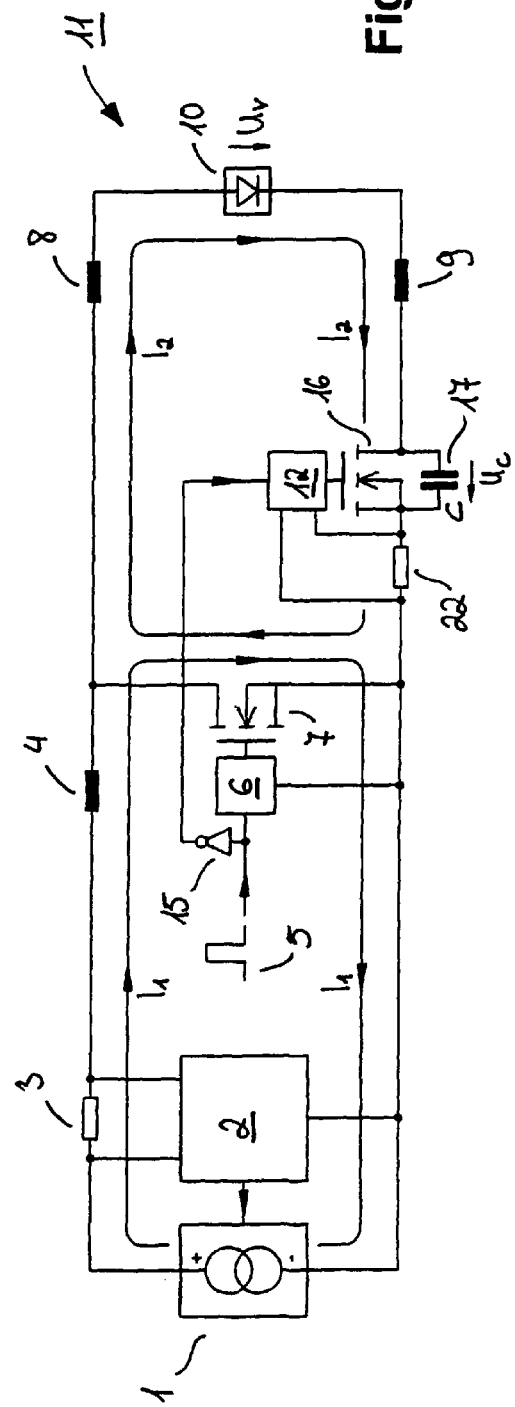
Fig. 10
Fig. 11

CIRCUIT AND METHOD FOR CONTROLLING THE POWER SUPPLY OF A CONSUMER WITH CURRENT PULSES HAVING STEEP FLANKS

The present invention concerns a circuit for controlling the power supply of a consumer, as well as a method of operating a circuit. The present invention especially concerns the power supply of a consumer with current pulses.

Figure 3:
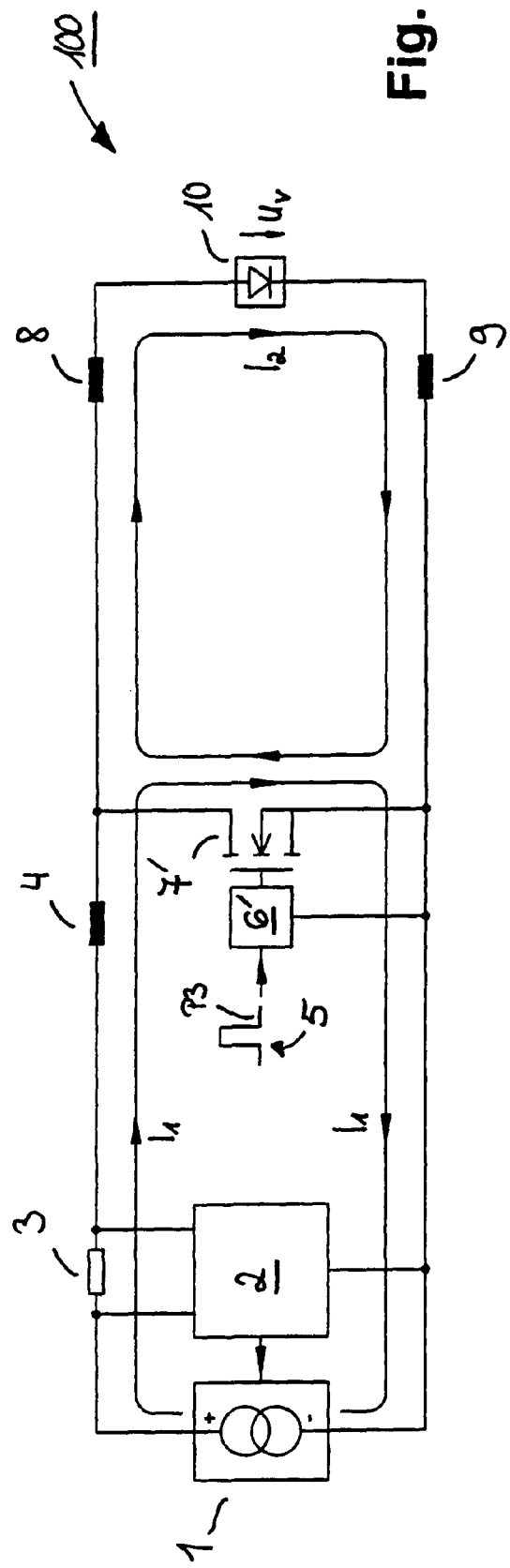

FIGS. 1-3 show a circuit as it is currently known. In the known circuit 100 a consumer 10 is supplied with power by means of a current source 1. By means of a control system 2, the power supplied by the current source 1 is maintained. Furthermore, the circuit comprises an inductance 4, as well as a switch 7' which is connected in parallel with the consumer 10. The switch 7' is controlled by means of a driver unit 6', whereas the driver unit 6' comprises an input for controlling the current pulses by means of a pulse control signal.

The functionality of the known circuit is divided in three phases P1, P2 and P3, depending on the pulse control signal 5. FIGS. 1-3 provide a schematic picture of the three phases, whereas FIG. 1 shows the first phase, FIG. 2 the second phase, and FIG. 3 the third phase.

The pulse control signal consists of pulses and intermediate pulse intervals. In the present description the first pulse interval is denoted with P1, a subsequent pulse with P2, and a second pulse interval following pulse P2 is denoted with P3.

During the phases P1 and P3 the pulse control signal 5 comprises a pulse interval by means of which the switch 7' is conductively controlled. In phase P2 the pulse control signal 5 comprises a pulse by means of which the switch 7' is block controlled. In the context of the invention, the term "closing" a switch means that the switch is conductively controlled by the respective driver unit. Similarly, the term "opening" a switch means that the switch is block controlled by the respective driver.

FIG. 1 provides a schematic picture of the first phase P1. During the pulse interval in phase P1, the first switch 7' is conductively controlled so that the adjusted power $I_1$, which has been impressed by the current source 1, flows through the inductance 4, then through the first switch 7' and back to the current source 1. In this phase P1, the consumer 10 is currentless.

FIG. 2 provides a schematic picture of the second phase P2. If a pulse occurs, the switch 7' is block controlled by the driver unit 6'. As a result, the impressed power $I_1$ no longer flows through the first switch 7' but through the consumer 10. Because of the behavior of the current source 1 and the inductance 4, a current pulse with short rise time is achieved in the consumer 10.

FIG. 3 provides a schematic picture of the third phase P3. During the pulse interval in the third phase P3, the switch 7 is again conductively controlled so that the power $I_1$ impressed by the current source 1 flows again through the inductance 4, through the switch 7' and back to the current source 1. The consumer 10 is no longer supplied with the power $I_1$ impressed by the current source.

The two lines to the consumer 10 each comprise a circuit inductance. In the drawing this is shown schematically by a first inductance 8 and a second inductance 9. By means of the magnetic energy stored in the first and second inductance 8 and 9 during the second phase, power $I_2$ flows in the third phase P3 through the consumer 10. At the start of the third phase P3, the power $I_2$ has the same value as the power $I_1$. However, with increasing time it is reduced until it finally reaches zero.

The time period t until the power $I_2$ drops to zero is calculated as follows:

$$t = \frac{I_1(L_1 + L_2)}{U_V}.$$

Here $I_1$ is the power impressed by the current source 1, $L_1$ is the value of the first inductance 8, $L_2$ is the value of the second inductance 9, and $U_V$ is the secondary voltage of the consumer 10. The formula shown above applies in case of a power-independent secondary voltage $U_V$.

For example, a circuit inductance of 50 nH, respectively, a power of 100 A and a secondary voltage of 2V results in the following fall time t:

$$t = \frac{100 \text{ A} \cdot (50 + 50) \cdot 10^{-9} H}{2 \text{ V}} = 5 \cdot 10^{-6} \text{ s}.$$

Consequently, the above-mentioned typical exemplary values result in a fall time of 5 μs, which is too long for a variety of applications.

In the known circuit a high fall time is of disadvantage because it does not allow for precise pulsed operation of a consumer.

Therefore, the present invention has the objective to provide a circuit for controlling the power supply of a consumer, as well as to provide a method for operating a circuit which allows for short rise times as well as short fall times.

This objective is achieved by means of the characteristics of the independent claims. Advantageous embodiments are discussed in the sub-claims.

The present invention concerns a circuit for operating a consumer comprising a current source to provide a power supply to a consumer and a first switch which is connected in parallel with the consumer, whereas by opening and closing the first switch the power is transmitted to the consumer in the form of square wave current pulses.

In this connection, a second switch, which is opened and closed in anti-phase manner to the first switch, has been provided. The second switch is connected in parallel with the first switch and in series with the consumer. Also provided is a load with high load voltage which is connected in parallel with the first switch and in series with the consumer.

Furthermore, the invention concerns a method for operating a circuit, in which the circuit comprises a current source to provide a consumer with power, a first switch which is connected in parallel with the consumer, a second switch which is connected in parallel with the first switch and in series with the consumer, and a load with high load voltage which is connected in parallel with the first switch and in series with the consumer. The method comprises the following steps: opening and closing the first switch to transmit square wave current pulses to the consumer and opening and closing the second switch in anti-phase manner to the first switch.

Advantageously, the current source is a DC current source.

In a first embodiment the load is connected in parallel with the second switch.

In this first embodiment, the load can comprise a resistor, a voltage-dependent resistor, a capacitor, a diode, a Zener diode, a suppressor diode, a semi-conductor with controlled avalanche behavior or a combination herefrom.

In a second to sixth embodiment, the second switch and the load are combined in one component.

Preferably, the load and the second switch are combined in a semi-conductor switch with controlled avalanche behavior.

Advantageously, it is possible to produce the controlled avalanche behavior of the semi-conductor switch by means of the characteristics of the semi-conductor.

Alternatively, the controlled avalanche behavior of the semi-conductor can be produced by means of external wiring of the semi-conductor.

In a second embodiment, a first protective diode is connected in parallel with the consumer.

In a third embodiment, a second protective diode is connected in series with the consumer.

In a fourth embodiment, a first resistor is connected in parallel with the second switch.

In a fifth embodiment, a constant current load is connected in parallel with the second switch.

In a sixth embodiment a system for current measurement has been provided and by means of a suitable arrangement a signal is supplied to the second switch in such a way that the second switch is again conductively controlled below a specific power.

Further characteristics, advantages and features of the present invention are explained by means of the figures of the accompanying drawings and the detailed description of the embodiments.

Figure 4:
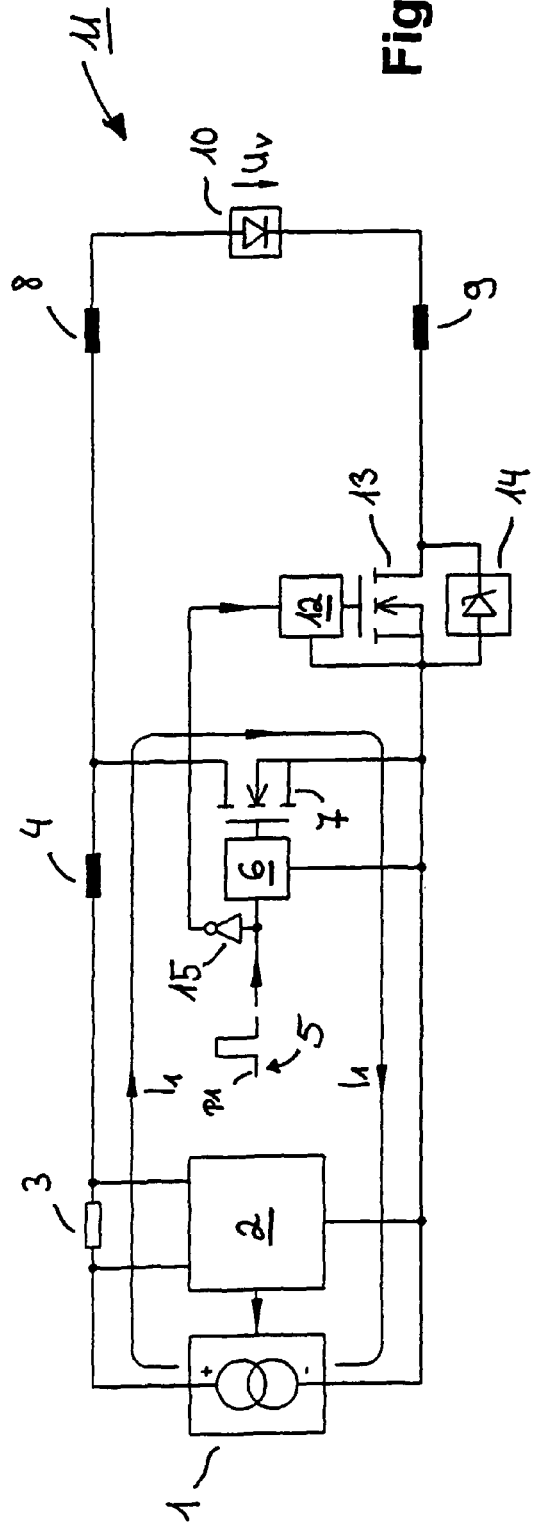
Figure 5:
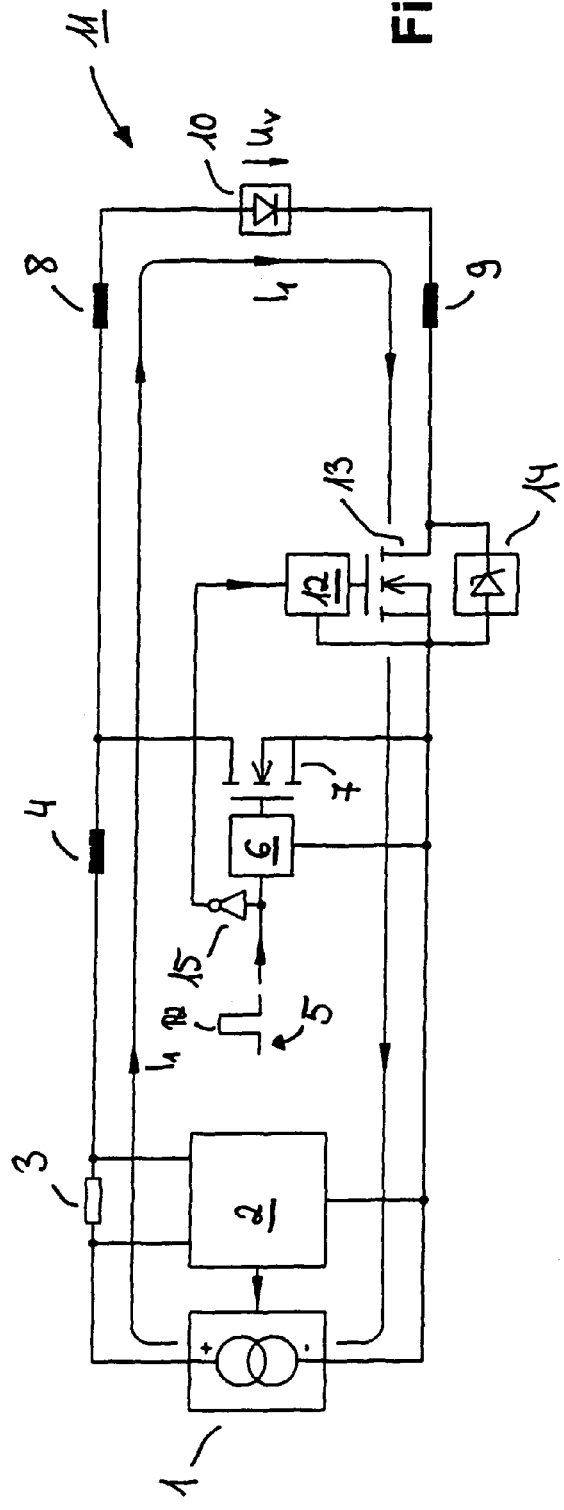
Figure 6:
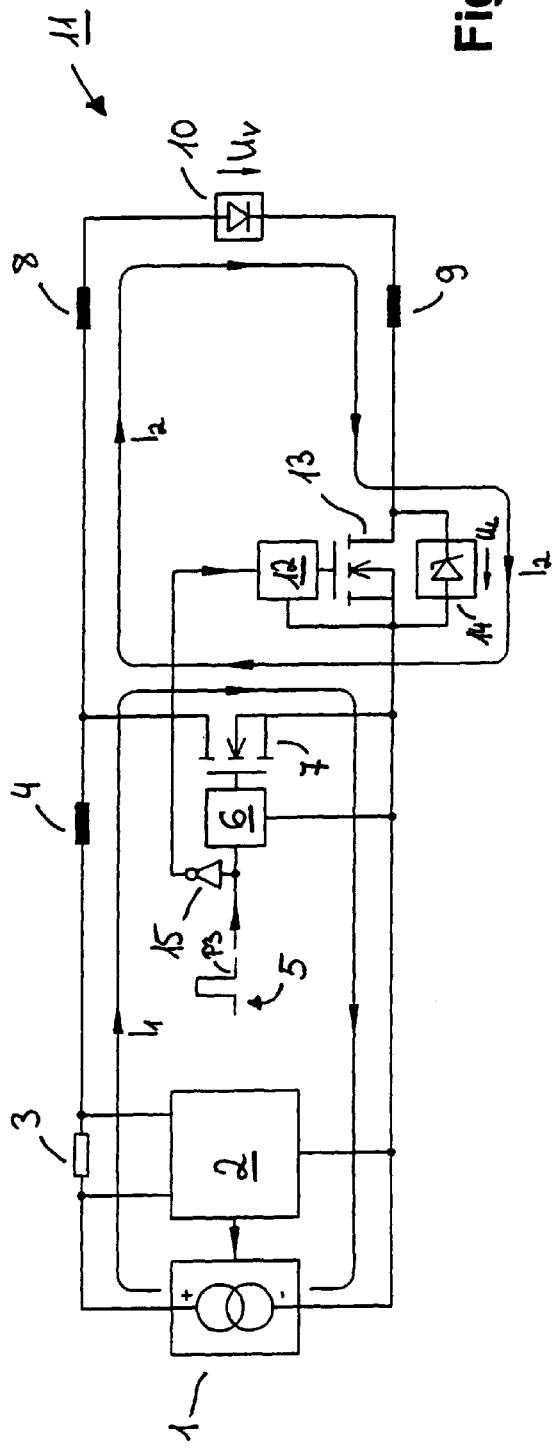
Figure 7:
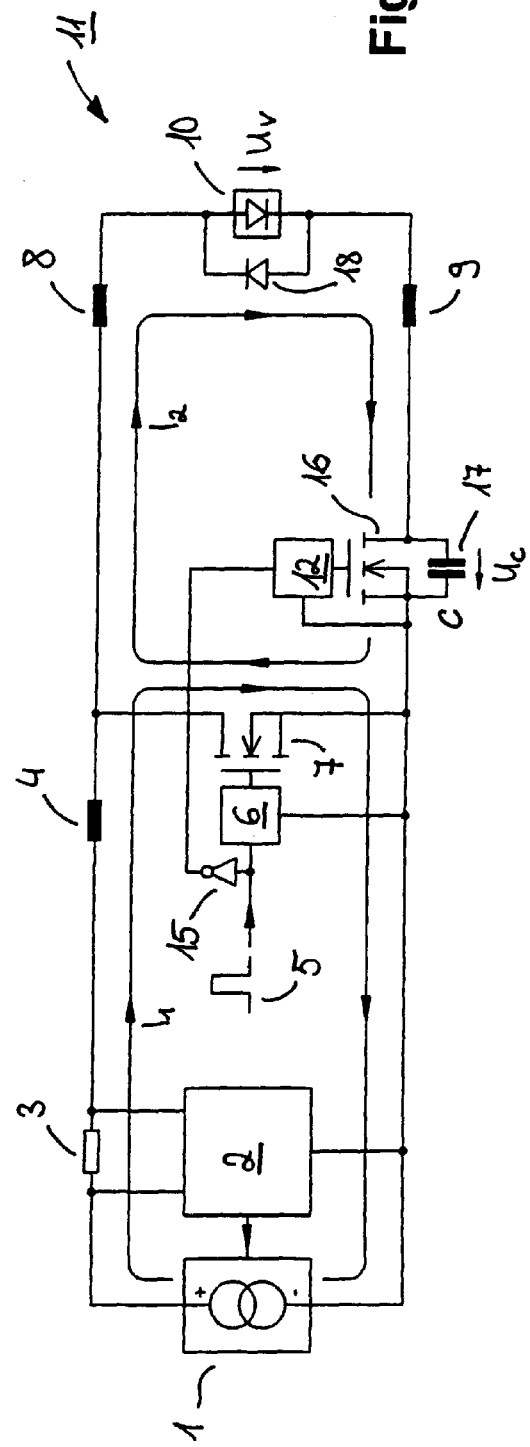

It is shown:

FIG. 1 a first phase of a known circuit,
FIG. 2 a second phase of a known circuit,
FIG. 3 a third phase of a known circuit,
FIG. 4 a first phase of a first embodiment of the present invention,
FIG. 5 a second phase of a first embodiment of the present invention,
FIG. 6 a third phase of a first embodiment of the present invention,
FIG. 7 the third phase of a second embodiment of the present invention,
FIG. 8 the third phase of a third embodiment of the present invention,
FIG. 9 the third phase of a fourth embodiment of the present invention,
FIG. 10 the third phase of a fifth embodiment of the present invention,
FIG. 11 the third phase of a sixth embodiment of the present invention, FIGS. 4-1 show the different embodiments of the present invention. The same components are depicted with the same reference numerals. A circuit 11 according to the present invention comprises a current source 1 which is preferably a switch mode current source 1 SMC. The current source 1 is controlled by means of a control system 2 so that the power $I_1$ provided by the current source 1 can be maintained. The control system comprises a current measuring device by means of a resistor 3 in order to guarantee that the current source is appropriately actuated.

Furthermore, the circuit 11 comprises a first inductance 4, as well as a consumer 10 which is supplied with power by means of the current source 1. In the embodiment shown, the consumer 10 is depicted in an exemplary manner as a diode operating in forward direction. However, the consumer 10 is not restricted to the embodiment shown and can be applied to any other consumer 10 which is operated with current pulses.

Parallel to the consumer 10, the circuit 11 comprises a switch 7 which is actuated by a first driver unit 6. For this purpose, the first driver unit 6 is supplied with a pulse control signal 5 consisting of pulses and pulse intervals so that during the pulse interval the switch 7 is conductively controlled via a driver unit 6, and during a pulse the switch is suddenly block controlled.

As previously explained, the present description depicts a first pulse interval with P1, a subsequent pulse with P2 and a second pulse interval following the pulse P2 with P3. Although the present description is restricted to explaining three pulse phases P1, P2 and P3, it is obvious that this phase is followed by a succession of several pulses and pulse intervals. Especially the phases P2 and P3 are repeated.

As previously explained, the known circuit involves problems with regard to long fall times. According to the present invention, it is proposed to provide a second switch which is connected in series with the consumer 10 and in parallel with the first switch 7, The second switch is actuated in anti-phase manner to the first switch 7, which means that if the first switch is block controlled the second switch is conductively controlled and vise versa. Furthermore, a load 14 has been provided which is arranged in series with the consumer 10 and parallel with the first switch 6 and which comprises a high load voltage. In this way the fall times can be considerably reduced.

The functionality of the invention-based circuit 11 is subsequently explained by means of the first embodiment depicted in FIGS. 4, 5 and 6. FIG. 4 shows the first phase P1 of the pulse control signal 5, FIG. 5 shows the second phase P2 of the pulse control signal 5, and FIG. 6 shows the third phase P3 of the pulse control signal 5.

FIG. 4 shows a pulse inverter which inverts the pulse control signal 5 and transmits the inverted signal to the second driver unit 12. In their functionality, the second driver unit 12 corresponds to the first driver unit 6 and is used to actuate the second switch 13. In this first embodiment, the load 14 is connected in parallel with the second switch 13.

FIG. 4 depicts the first phase P1 of the pulse control signal 5. During the pulse interval, the first switch 7 is conductively controlled, and the second switch 13 is block controlled. The adjusted power $I_1$, which has been impressed by the current source 1, flows through the first inductance 4 and the first switch 7 back to the current source 1. The consumer 10, the load 14 and the switch 13 are currentless.

FIG. 5 provides a schematic picture of the second phase P2, namely the pulse signal. By means of the pulse signal, the first switch 7 is suddenly block controlled and, at the same time, the second switch 13 is conductively controlled so that the power $I_1$ impressed via the current source 1 no longer flows through the first switch 7 but, because of the behavior of the current source 1 and the inductance 4, said power flows back with a short rise time to the current source 1 in the form of pulses and square waves through the consumer 10 and the second switch 13.

FIG. 6 provides a schematic picture of the third phase P3. In this pulse interval, the first switch 7 is again conductively controlled and, at the same time, the second switch 13 is block controlled. In this way, the consumer 10 and the second switch 13 become currentless, and the impressed power $I_1$ flows again back to the current source 1 via the inductance and the first switch 7.

At the start of the third phase P3, power $I_2$ flows through the consumer 10 because of the magnetic energy stored during the second phase P2 in the circuit inductances 8, 9. At the start of the third phase P3, power $I_2$ has the same value as the power $I_1$. However, with increasing time, the power is reduced until it finally reaches zero.

In the first embodiment at hand, a first load 14 has been provided parallel to the second switch. In the embodiment at hand, said load can represent a Zener diode with high Zener voltage. At this, the decaying power $I_2$ generates at the load 14 a load voltage $U_L$ which, together with the secondary voltage $U_V$ of the consumer 10, forms an overall voltage with regard to the fall time of the power $I_2$. Advantageously, the first load 14 is designed in such a way that it produces high load voltage $U_L$, resulting in a very short fall time of the power $I_2$.

If the secondary voltage $U_V$ and the load voltage $U_L$ are not current-dependent, the following applies to the fall time t of the power $I_2$:

$$t = \frac{I_1(L_1 + L_2)}{U_V + U_L}$$

In the previously mentioned example with a circuit inductance of 50 nH, respectively, a load current of 100 A, a secondary voltage $U_V$ of 2V, and a load voltage $U_L$ of 100 V, respectively, the fall time results in:

$$t = \frac{100 \text{ A} \cdot (50 + 50) \cdot 10^{-9} H}{2 \text{ V} + 100 \text{ V}} = 98 \cdot 10^{-9} \text{ s}$$

By means of the invention-based anti-phase actuation of both switches it is possible within a short period of time to bring the power $I_2$ efficiently to zero via a load with high load voltage.

FIGS. 4, 5 and 6 show a first embodiment in which the switch 13 preferably comprises a semi-conductor switch and the load 14 is connected in parallel with the second switch 13. The load can comprise a resistor, a voltage-dependent resistor, a capacitor, a diode, a Zener diode, a suppressor diode, a controllable semi-conductor with controlled avalanche behavior or a behavior similar to a Zener diode or a combination of the elements mentioned. Here, a semi-conductor with controlled avalanche behavior in the sense of the present invention is a controllable semi-conductor, for example, a bipolar transistor, FET, IGBT, with a defined breakdown voltage. If a voltage at this semi-conductor reaches or exceeds the breakdown voltage, the semi-conductor becomes conductive (avalanche breakthrough) despite the blockage at the control input and maintains the voltage present at a value which corresponds to its breakdown voltage.

FIG. 7 shows a second embodiment according to the circuit 11 of the present invention. The second switch 16 used in the embodiment shown in FIG. 7 is a semi-conductor switch with controlled avalanche behavior, which provides this switch with the additional function of a load. Consequently, it is not required to have, as in the first embodiment, an additional load which is connected in parallel with the switch. The avalanche behavior of the second switch 16 can be produced through the characteristics of the semi-conductor itself or through suitable external wiring of the semi-conductor. At the start of the third phase P3 described in FIG. 7, while the second switch 16 is block controlled, the power $I_2$ generates at the second switch such high voltage that said switch reaches the avalanche breakthrough and keeps the present voltage at the value of the breakdown voltage until the power $I_2$ has reached zero. If a semi-conductor with high breakdown voltage is selected for the second 16, the fall time of the power $I_2$ is very short.

FIGS. 7-11 show further embodiments of the present invention-based circuit 11, in which the second switch 16, respectively, is a semi-conductor switch with controlled avalanche behavior. In the embodiments shown, the second switch 16 has a parasitic parallel capacity (drain-source capacity), which is displayed in the diagram as a capacitor 17 with a capacity C. At the start of the third phase P3, when the power $I_2$ approaches the zero point, the second switch 16 transfers, while the breakdown voltage is present, from the avalanche breakthrough to the blocking state. At this the parallel capacity remains unwantedly loaded at a voltage value of $U_C$, corresponding to the value of the breakdown voltage of the second switch 16. This voltage $U_C$ is directed in such a way that it rests inversely against the consumer 10. If, for example, a diode with low blocking voltage is used as consumer 10, it would be destroyed as a result of the present inverse voltage. In the following embodiment this problem is avoided.

FIG. 7 shows a second embodiment of the present invention, in which a first protective diode 18 is connected in parallel with the consumer 10, thus avoiding an inverse voltage at the consumer 10.

FIG. 8 shows a third embodiment of the invention-based circuit 11, in which a second protective diode 19 is connected in series with the consumer 10, also in this case avoiding an inverse voltage at the consumer 10.

FIG. 9 shows a fourth embodiment, in which a first resistor 20 is connected in parallel with the second switch 16, thus discharging the parasitic parallel capacity C of the capacitor 17. Here the resistor is dimensioned in such a way that at the time in which the power $I_2$ has reached zero also the voltages $U_C$ at the second switch 16 has reached zero. Consequently, the capacity C have been discharged and inverse voltage at the consumer 10 has been avoided.

FIG. 10 shows a fifth embodiment of the invention-based circuit 11, in which a constant current load 21 is connected in parallel with the second switch 16, thus discharging the capacity. Here the constant current load 21 is dimensioned in such a way that at the time in which the power $I_2$ has reached zero also the voltage $U_C$ at the second switch 16 has reached zero. Consequently, the capacity C has been discharged and inverse voltage at the consumer 10 has been avoided.

FIG. 11 shows a sixth embodiment of the invention-based circuit, in which the power $I_2$ is measured via an exemplary second resistor 22 which is connected in series with the second switch 16, and the measuring signal is supplied to the second switch 16 via a suitable arrangement in the driver circuit 12 in such a way that said switch is again conductively controlled below a specific current value $I_2$ and thus the capacity is discharged if the power $I_2$ has reached zero. Thus no inverse voltage occurs at the consumer 10. Instead of performing a current measurement by means of a resistor, it is also possible to use any other type of current measurement in order to conductively control again the second switch 16 below a specific current value $I_2$. For example, the current measurement can also be performed by means of a current transformer.

The possibilities mentioned in the embodiments two to six with regard to providing the consumer 10 with a protection against inverse voltage can also be applied to the first embodiment.

Therefore, the present invention makes it possible to supply a consumer 10 with current pulses having a short rise time and, at the same time, a short fall time.

The invention claimed is:
1. A circuit for operating a consumer comprising:
a current source with an inductance connected in series for providing a power supply for a consumer and
a first switch connected in parallel with the current source and the inductance, in which through opening and closing of the first switch the power is transmitted to the consumer in the form of square wave current pulses, a series connection arranged in parallel with the first switch, which series connection comprises the consumer and a second switch which is opened and closed in anti-phase manner to the first switch, with the second switch having a parasitic capacitance, and a switch load comprising a resistor with a load voltage connected in parallel with the second switch, wherein the resistor discharges the parasitic capacitance to avoid an inverse voltage at said consumer when the second switch is opened.

2. A circuit according to claim 1, wherein the current source is a DC current source.

3. A circuit according to claim 1, wherein the load further comprises at least one of a voltage-dependent resistor, a capacitor, a diode, a Zener diode, a suppressor diode, or a semi-conductor with controlled avalanche behavior.

4. A circuit according to claim 1, wherein the load and the second switch are combined in a semi-conductor switch with controlled avalanche behavior.

5. A circuit according to claim 4, wherein the controlled avalanche behavior of the semi-conductor switch results from the characteristics of the semi-conductor.

6. A circuit according to claim 4, wherein the controlled avalanche behavior of the semi-conductor can result from external wiring of the semi-conductor.

7. A circuit according to claim 1, wherein a first protective diode is connected in parallel with the consumer.

8. A circuit according to claim 1, wherein the series connection comprises an additional second protective diode.

9. A circuit according to claim 1, wherein a first resistor is connected in parallel with the second switch.

10. A circuit according to claim 1, wherein a constant current load is connected in parallel with the second switch.

11. A circuit according to claim 1, wherein the series connection comprises an additional second resistor and wherein a system for current measurement is provided, and wherein a signal is supplied to the second switch such that the second switch is again conductively controlled below a specific power to prevent an inverse voltage at the consumer.

12. A method for operating a circuit, wherein the circuit comprises a current source with an inductance connected in series for providing a power supply to a consumer, a first switch which is connected in parallel to the series connection consisting of the current source and the inductance, a series connection which is arranged in parallel with the first switch, which series connection comprises the consumer and a second switch, and a load comprising a resistor with a load voltage connected in parallel with the second switch, and with the second switch including a parasitic capacitance, the method comprising the steps:

opening and closing of the first switch in order to transmit square wave current pulses to the consumer and opening and closing of the second switch in anti-phase manner to the first switch;

wherein the resistor discharges the parasitic capacitance to avoid an inverse voltage at the consumer when the second switch is opened.

13. The method of claim 12, wherein the second switch comprises a field-effect transistor (FET).

14. The method of claim 12, wherein when the power through the consumer has reached zero the voltage at the second switch has reached zero and the parasitic capacitance has been discharged.

15. The circuit according to claim 1, wherein the second switch comprises a field-effect transistor (FET).

16. The circuit according to claim 1, wherein the resistor is sized such that when the power through the consumer has reached zero the voltage at the second switch has reached zero and the parasitic capacitance has been discharged.

* * * * *